(12) United States Patent
Schulz et al.

(10) Patent No.: US 12,087,544 B2
(45) Date of Patent: *Sep. 10, 2024

(54) PLASMA GENERATOR, PLASMA TREATMENT DEVICE, AND METHOD FOR PROVIDING ELECTRIC POWER IN A PULSED MANNER

(71) Applicant: CENTROTHERM INTERNATIONAL AG, Blaubeuren (DE)

(72) Inventors: Sebastian Hubertus Schulz, Blaubeuren (DE); Thomas Pernau, Blaubeuren (DE); Florian Nachbauer, Blaubeuren (DE); Felix Walk, Blaubeuren (DE)

(73) Assignee: CENTROTHERM INTERNATIONAL AG, Blaubeuren (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/731,774

(22) Filed: Apr. 28, 2022

(65) Prior Publication Data
US 2022/0254609 A1   Aug. 11, 2022

Related U.S. Application Data

(62) Division of application No. 16/498,728, filed as application No. PCT/EP2018/058193 on Mar. 29, 2018, now Pat. No. 11,355,316.

(30) Foreign Application Priority Data

Mar. 31, 2017 (DE) .......................... 102017205582.0
Mar. 26, 2018 (DE) .......................... 102018204585.2

(51) Int. Cl.
*H01J 37/32* (2006.01)
*H05H 1/46* (2006.01)

(52) U.S. Cl.
CPC .. *H01J 37/32146* (2013.01); *H01J 37/32155* (2013.01); *H01J 37/32174* (2013.01);
(Continued)

(58) Field of Classification Search
None
See application file for complete search history.

(56) References Cited

U.S. PATENT DOCUMENTS 3,500,118 A * 3/1970 Anderson ............... H05B 47/20
                                                      331/185
3,657,591 A * 4/1972 Johnson .................. H01J 61/72
                                                      313/574
(Continued)

FOREIGN PATENT DOCUMENTS

| JP | H03247748   | 11/1991 |
|----|-------------|---------|
| KR | 20160049628 | 5/2016  |
| KR | 20160097438 | 8/2016  |

*Primary Examiner* — Srinivas Sathiraju
(74) *Attorney, Agent, or Firm* — Tarolli, Sundheim, Covell & Tummino LLP

(57) ABSTRACT

A plasma generator and a method for the pulsed provision of electrical power having a frequency of at least 40 KHz to at least two process chambers are described. The plasma generator comprises: a control unit configured to obtain and evaluate process data about processes in the at least two process chambers; a controllable power supply having an output, the controllable power supply being configured to output a direct current at a predetermined voltage and/or intensity at its output in response to a control signal from the control unit; and a switching unit having a first input connected to the output of the power supply and having at least two switching unit outputs for respective connection to one of the at least two process chambers. The switching unit (Continued)

is configured to form, from a direct current at the input, an alternating current having a predetermined frequency of at least 40 KHz as an output signal and to selectively output the output signal as a pulse for a predetermined pulse duration to one of the switching unit outputs in response to a control signal from the control unit. The control unit is configured to coordinate power requirements of the at least two process chambers and to drive the power supply and the switching unit such that at the respective switching unit outputs communicating with the process chambers, substantially the power corresponding to the power requirements is provided as pulses over a period of time, wherein the pulses of the respective process chambers are temporally offset from each other such that the process chambers can be operated simultaneously.

17 Claims, 9 Drawing Sheets

(52) U.S. Cl.
CPC .... *H01J 37/32944* (2013.01); *H01J 37/3299* (2013.01); *H05H 1/46* (2013.01)

(56) References Cited

U.S. PATENT DOCUMENTS

| | | | | |
|---|---|---|---|---|
| 3,987,334 A * | 10/1976 | Anderson | H01J 65/042 | 315/276 |
| 3,987,335 A * | 10/1976 | Anderson | H01J 65/048 | 315/276 |
| 4,017,764 A * | 4/1977 | Anderson | H01J 65/048 | 315/348 |
| 4,048,541 A * | 9/1977 | Adams | H01J 65/048 | 315/344 |
| 4,180,763 A * | 12/1979 | Anderson | H01J 65/048 | 315/344 |
| 4,431,898 A * | 2/1984 | Reinberg | C23F 4/00 | 156/345.35 |
| 6,150,628 A * | 11/2000 | Smith | H01J 27/16 | 156/345.28 |
| 6,418,874 B1 * | 7/2002 | Cox | H01J 37/321 | 156/345.48 |
| 6,893,907 B2 * | 5/2005 | Maydan | H01J 37/321 | 438/149 |
| 7,137,354 B2 * | 11/2006 | Collins | H01J 37/321 | 156/345.35 |
| 7,161,112 B2 * | 1/2007 | Smith | H01J 27/16 | 156/345.48 |
| 7,223,676 B2 * | 5/2007 | Hanawa | H01J 37/32174 | 438/513 |
| 7,569,790 B2 * | 8/2009 | Holber | H05H 1/46 | 219/121.41 |
| 8,124,906 B2 * | 2/2012 | Holber | H05H 1/46 | 219/121.48 |
| 8,742,665 B2 * | 6/2014 | Lubomirsky | H01J 37/32357 | 315/111.41 |
| 8,771,538 B2 * | 7/2014 | Lubomirsky | H01J 37/32357 | 315/111.41 |
| 8,880,227 B2 * | 11/2014 | Mahadeswaraswamy | G05B 15/02 | 700/121 |
| 8,883,246 B2 * | 11/2014 | Nicolescu | C23C 14/22 | 427/571 |
| 8,884,525 B2 * | 11/2014 | Hoffman | H05H 1/46 | 315/111.41 |
| 8,952,765 B2 * | 2/2015 | Fisk, II | H03B 5/1237 | 330/296 |
| 9,065,426 B2 * | 6/2015 | Mason | H01J 37/32183 | |
| 9,147,555 B2 * | 9/2015 | Richter | H01J 37/32064 | |
| 9,208,992 B2 * | 12/2015 | Brouk | H01J 37/24 | |
| 9,210,790 B2 * | 12/2015 | Hoffman | C23C 14/345 | |
| 9,341,610 B1 * | 5/2016 | McIver | G01N 33/22 | |
| 9,466,469 B2 * | 10/2016 | Khaja | H01J 37/32357 | |
| 9,514,917 B1 * | 12/2016 | McIver | H05H 1/52 | |
| 9,721,758 B2 * | 8/2017 | Coumou | H01J 37/32174 | |
| 9,909,215 B2 * | 3/2018 | Holber | H01J 37/321 | |
| 9,941,102 B2 * | 4/2018 | Kouznetsov | C23C 14/351 | |
| 10,082,346 B2 * | 9/2018 | Elser | H01L 21/67098 | |
| 10,443,150 B2 * | 10/2019 | Holber | C23C 16/272 | |
| 10,636,934 B2 * | 4/2020 | Pernau | H01L 31/1876 | |
| 10,665,351 B2 | 5/2020 | Binderbauer et al. | | |
| 10,699,881 B2 * | 6/2020 | Wei | H03H 7/38 | |
| 10,991,550 B2 * | 4/2021 | Juco | H01J 37/32183 | |
| 11,355,316 B2 * | 6/2022 | Schulz | H01J 37/3299 | |
| 2003/0071035 A1 * | 4/2003 | Brailove | H05H 1/46 | 219/635 |
| 2017/0018926 A1 * | 1/2017 | Coumou | H01J 37/32899 | |
| 2017/0365907 A1 * | 12/2017 | Kapoor | C23C 16/52 | |
| 2018/0019102 A1 * | 1/2018 | Voronin | H01J 37/32082 | |
| 2019/0108977 A1 * | 4/2019 | Wei | H01L 21/67011 | |
| 2019/0326023 A1 | 10/2019 | Yang | | |
| 2020/0066497 A1 * | 2/2020 | Engelstaedter | C23C 16/50 | |
| 2020/0105516 A1 * | 4/2020 | Fuchs | H01L 21/0217 | |
| 2021/0111001 A1 * | 4/2021 | Schulz | H01J 37/3299 | |
| 2022/0208518 A1 * | 6/2022 | Long | H01J 37/32091 | |
| 2022/0254609 A1 * | 8/2022 | Schulz | H01J 37/32146 | |
| 2022/0384144 A1 * | 12/2022 | Long | H01J 37/3211 | |

* cited by examiner

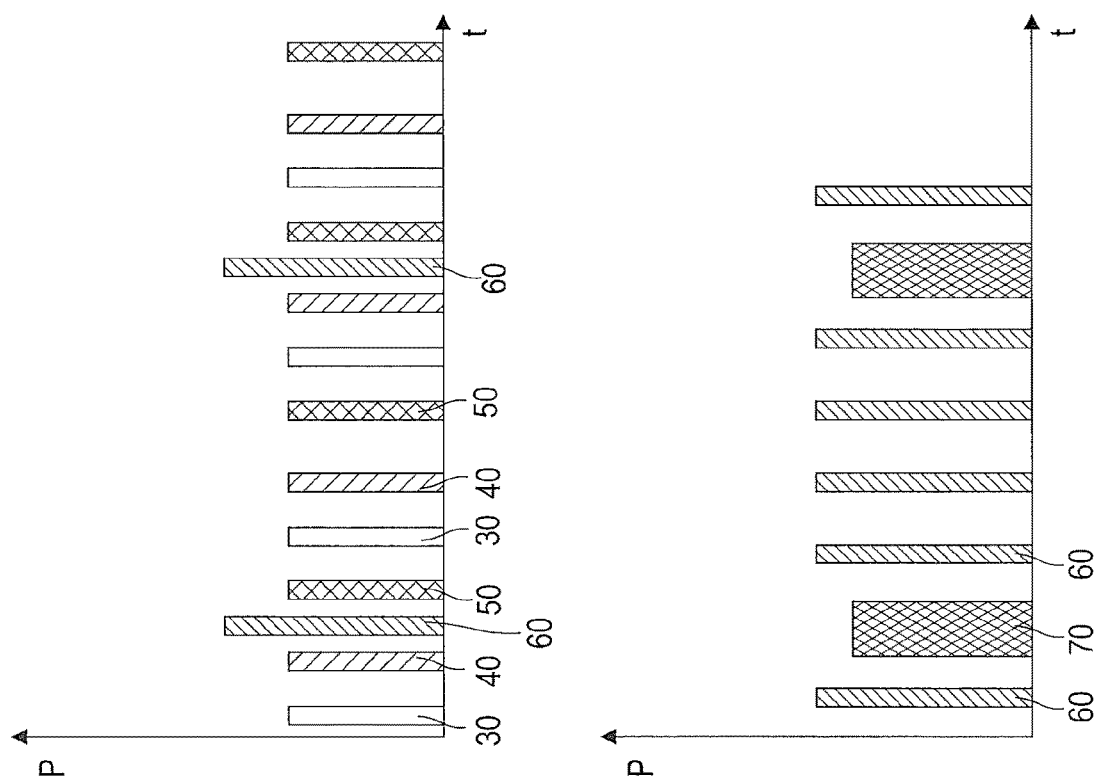

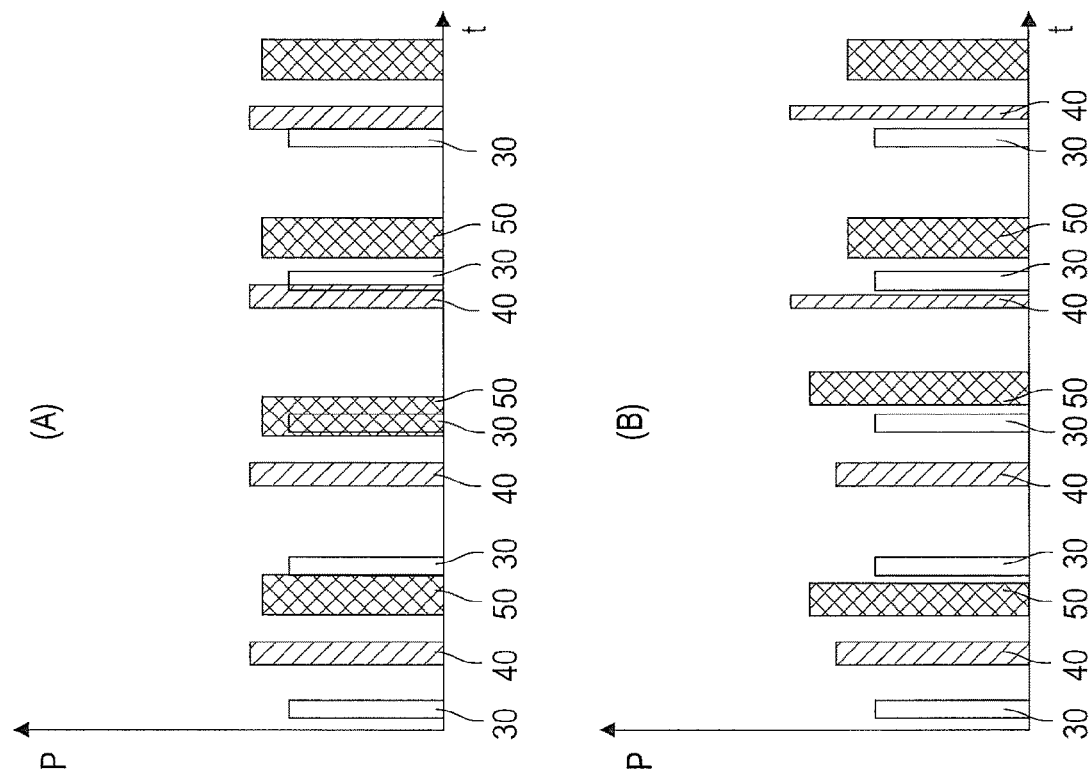

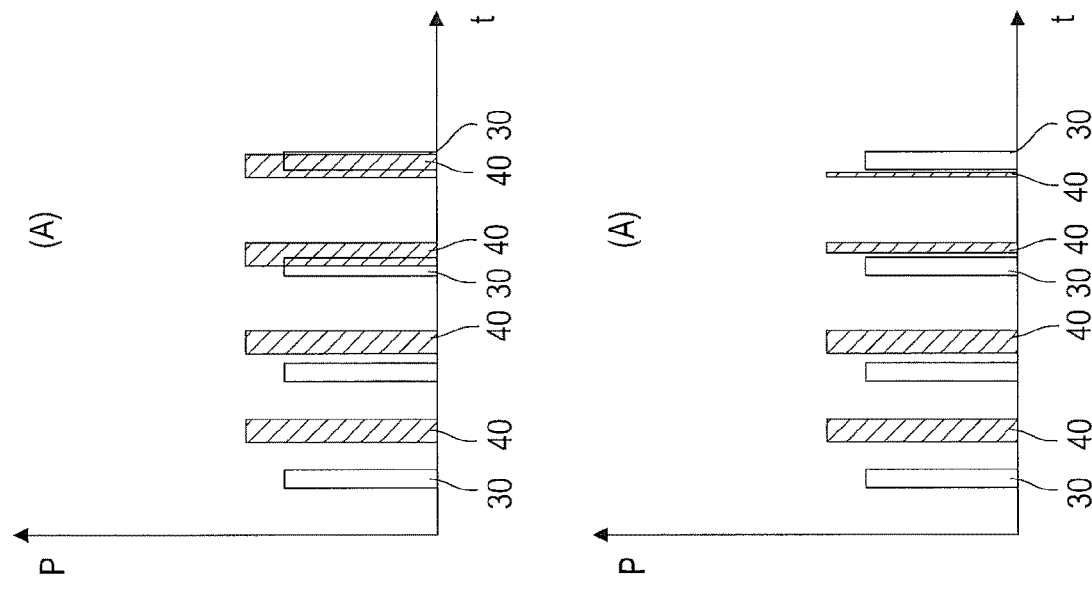
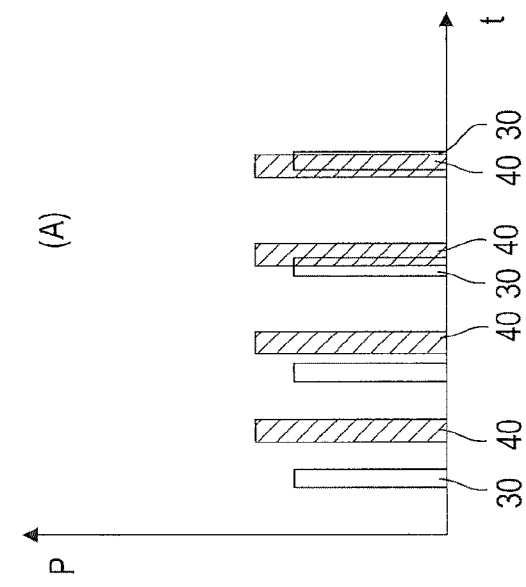
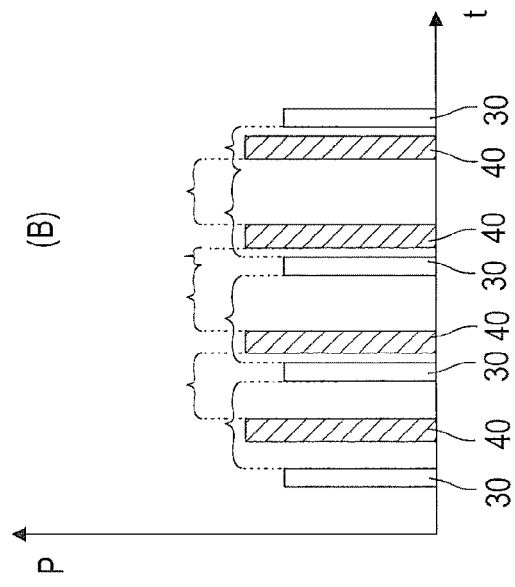

PLASMA GENERATOR, PLASMA TREATMENT DEVICE, AND METHOD FOR PROVIDING ELECTRIC POWER IN A PULSED MANNER

RELATED APPLICATIONS

This application is a divisional of U.S. application Ser. No. 16/498,728, filed on Sep. 27, 2019, which corresponds to PCT/EP2018/058193, filed Mar. 29, 2018, which claims the benefit of German Application Nos. 10 2017 205 582.0, filed Mar. 31, 2017 and 10 2018 204 585.2, filed Mar. 26, 2018, the subject matter of which are incorporated herein by reference in their entirety.

BACKGROUND OF THE INVENTION

The present invention relates to a plasma generator for the pulsed provision of electrical power having a frequency of at least 40 KHz, a plasma treatment device and a method for the pulsed provision of electrical power having a frequency of at least 40 KHz.

A wide variety of applications are known in technology in which an electrical power having a frequency of at least 40 KHz is provided to excite a plasma from a gas and to maintain the plasma for certain processes. An example of this is the plasma assisted vapor phase deposition in semiconductor technology or the photovoltaic industry.

For such a deposition, wafers are loaded in so-called wafer boats, which are made in part of electrically conductive plates and are placed in corresponding process chambers. An electrical power having a frequency of at least 40 KHz is then applied to the wafer boats in order to generate a plasma from a suitable process gas between the plates and between the wafers accommodated on the plates. An example of such a plasma treatment device is shown in DE 10 2015 004 419 A1 of the applicant or the present application.

Such plasma treatment devices usually have of a single process chamber and a single plasma generator assigned thereto. In the adjacent arrangement of several process chambers, a common use of gas cabinets and other peripheral equipment has been considered in some cases, but until now each process chamber has a single plasma generator. Such a plasma generator typically has a controllable power supply with an output capable of outputting at its output a direct current with a predetermined voltage and/or intensity, a converter capable of forming, from a direct current at its input, an alternating current having a predetermined frequency of at least 40 KHz as an output signal, and applying the output signal to the process chamber connected thereto. The power supply and the converter are usually driven by a controller which determines the required power for the process chamber and generates respective control signals. Usually an arc suppression unit is also provided which is configured to obtain and evaluate in real time current process data about processes of the process chamber and current data of the power supply and/or the switch in order to detect an arc or an impending arc, the arc suppression unit being in communication with the power supply and/or the switch in order to control the same, if necessary, in response to the detection of an arc or an impending arc, in order to prevent or rapidly suppress arcing in the process chamber.

During the processes, the electrical power is usually provided periodically as a pulse by the respective plasma generator, whereby a duty cycle (quotient of duration or the pulse and duration of the cycle) of less than 0.1 is usually set here over long periods of time. Such pulsed operation of a plasma in the process chamber has proven to be particularly advantageous. Typically, 90% of the available continuous power of a plasma generator remains unused over long stretches of the processes. There are also processes with substantially smaller duty cycles but also processes or process sections with higher duty cycles.

SUMMARY OF THE INVENTION

It is therefore an object of the present invention to make the provision of electrical power more efficient. According to the invention, this object is solved by a plasma generator according to claim 1, a plasma treatment device according to claim 14 and a process according to claim 17. Further embodiments of the invention are inter alia disclosed in the dependent claims.

In particular, a plasma generator for the pulsed provision of electrical power having a frequency of at least 40 KHz to at least two process chambers is provided, the plasma generator comprising: a control unit configured to obtain and evaluate process data about processes in said at least two process chambers; a controllable power supply having an output, the power supply configured to output a direct current having a predetermined voltage and/or intensity at its output in response to a control signal from said control unit; and a switching unit having a first input connected to the output of said power supply and having at least two switching unit outputs for respective connection to one of said at least two process chambers;

wherein the switching unit is configured to form from a direct current at the input an alternating current having a predetermined frequency of at least 40 KHz as an output signal and to selectively output the output signal as a pulse for a predetermined pulse duration to one of the switching unit outputs in response to a control signal from the control unit; the control unit being configured to coordinate power requirements (also called power requests) of the at least two process chambers and to drive the power supply and the switching unit such that at the respective switching unit outputs communicating with the process chambers, substantially the power corresponding to the power requirements is provided as pulses over a period of time, wherein the pulses are temporally offset from each other such that the process chambers can be operated simultaneously.

Such a plasma generator enables the coordinated provision of pulsed power to a plurality of process chambers, thus increasing the efficiency of the plasma generator. The acquisition costs for a multi-chamber plasma treatment unit can be significantly reduced as the number of plasma generators required can be at least halved if not further reduced. In particular, process chambers in which similar processes are performed can be efficiently coordinated.

In one design, the control unit has a number of controllers corresponding to the number of process units to be connected to the switching unit, each controller being configured to obtain process data on processes in a respective one of the process chambers, each controller being connected to the power supply and/or switch to drive the same in response to the process data received. This ensures a good and safe control of the respective processes. Further, the plasma generator may comprise at least one arc suppression unit configured to receive and evaluate in real time current process data about processes in the at least two process chambers and current data of the power supply and/or the switch to detect an arc or an impending arc, the arc suppression unit being in communication with the power supply and/or the switch to control the same if needed in response to the detection of an arc or an impending arc, if any. The arc suppression unit can form part of the control unit.

The controllers and/or at least one arc suppression unit may be designed as separate software modules executable on a common processor or on separate processors of the plasma generator.

In one embodiment, the switching unit has at least one third switching unit output configured for connection to at least one further process chamber or an absorber, and wherein the switching unit is configured to, in response to an incoming control signal from the control unit, apply the output signal as a pulse selectively to a respective one of the switching unit outputs for a predetermined pulse duration to enable even more efficient use of the plasma generator. The switching unit may have at least one switching unit output suitable for connection to an absorber, the switching unit being configured to, in response to an incoming control signal, selectively apply the output signal as a pulse to the switching unit output for the absorber for a predetermined pulse duration in order to avoid or suppress an overload or an arc in a process chamber.

For simple coordination, the control unit may be designed to coordinate the sum of pulse duration and a corresponding pulse pause at the respective switching unit outputs such that the sum is equal or that the sum at one of the switching unit outputs is a multiple of the sum at another switching unit output.

Preferably, the control unit is designed to shift pulses in time with respect to the power requirements if the power requirements would lead to an overlapping of pulses at different outputs, wherein a respective time shift is selected so that the energy output at the respective outputs essentially corresponds to the power requirement over time. Alternatively or additionally, the control unit may be designed to divide individual pulses into two separate pulses with respect to the power requirements and to shift them in time if the power requirements would lead to overlapping of pulses at different outputs, wherein a respective division and shift in time is selected such that the energy output at the respective outputs essentially corresponds to the power requirement over time. It is also additionally or alternatively possible that the control unit is designed in such a way that it shifts individual pulses in time with respect to the power requirements if the power requirements would lead to an overlapping of pulses at different outputs, wherein a respective shift in time is selected in such a way that the energy output at the respective outputs essentially corresponds to the power requirement over time. According to a preferred embodiment, the control unit is designed so that it can change at least one of the following parameters of a pulse: a position of a pulse in a pulse sequence, a division of a pulse into partial pulses, a pulse duration and an amplitude of a pulse, when actual power requirements would lead to overlapping of pulses at different outputs.

According to a further embodiment, the plasma generator is designed to provide pulsed electrical power at a frequency of at least 40 KHz to at least three process chambers and further comprises the following: a control unit configured to obtain and evaluate process data about processes in said at least three process chambers; an additional controllable power supply having an output, the power supply being configured to output a direct current having a predetermined voltage and/or intensity at its output in response to a control signal from said control unit; and an additional switching unit having a power input connected to the output of the power supply and having at least three switching unit outputs for respective connection to one of the at least three process chambers; wherein the switching unit is configured to form from a direct current at the input an alternating current having a predetermined frequency of at least 40 KHz as an output signal and to selectively output the output signal as a pulse having a predetermined pulse duration to one of the switching unit outputs in response to a control signal from the control unit; wherein the control unit is configured to coordinate the power requirements of the at least three process chambers and to drive the power supplies and the switching units such that at a respective one of the switching unit outputs, communicating with the process chambers, the respective power corresponding to the power requirements is in substance available as pulses over time, wherein the pulses provided by one switching unit for the process chambers are temporally offset from each other while the pulses of the two switching units may overlap. This can result in a higher flexibility of the pulse coordination. The power supplies can have different rated powers to meet different power requirements.

The invention also relates to a plasma treatment device having at least two separate process chambers in each of which a plasma can be generated and a plasma generator of the type described above, whereby process chambers are each connected to one of the switching unit outputs of the switching unit.

In one embodiment, such a plasma treatment device has at least three separate process chambers, wherein the switching unit of the plasma generator has at least three switching unit outputs, and the process chambers are each connected to one of the switching unit outputs. In addition, the plasma treatment device may also have an absorber, wherein the switching unit of the plasma generator has at least three switching unit outputs, and the absorber is connected to one of the switching unit outputs.

The invention also relates to a method for the pulsed provision of electrical power having a predetermined frequency of at least 40 KHz to at least two separate process chambers, the method comprising the following steps: providing a direct current having a predetermined voltage and/or intensity at an input of a switching unit in response to a control signal from a control unit; forming, from said direct current, an alternating current output signal having a predetermined frequency of at least 40 KHz in said switching unit and, in response to a control signal from said control unit, selectively outputting said alternating current output signal as a pulse having a predetermined pulse duration at one of at least two switching unit outputs of said switching unit, each of which is connected to one of said at least two separate process chambers; wherein said control unit generates control signals for providing said direct current and control signals for selectively outputting said alternating current output signal in response to power requirements of said at least two process chambers and in response to process data about processes in said at least two process chambers, wherein the control signals are coordinated such that at the respective switching unit outputs which are connected to the process chambers, essentially the power corresponding to the power requirements is made available as pulses over time, and the pulses for the process chambers are temporally offset with respect to each other, while the process chambers are operated simultaneously. Such a procedure allows the above mentioned advantages of a more efficient use of a plasma generator.

Preferably, the control unit changes at least one of the following parameters of a pulse: a position of a pulse in a pulse sequence, a division of a pulse into partial pulses, a pulse duration and an amplitude of a pulse, if actual power requirements would lead to an overlapping of pulses at different outputs. The process is thus flexible and can adapt to a variety of requirements. The control unit can make an adjustment according to predefined fixed rules or according to operator-adjustable rules. The control unit can compare the power output in pulses per process chamber over time with the power requested over time and automatically adjust at least one parameter of a pulse based on the comparison.

In one embodiment, the electrical power is provided to at least three separate process chambers, wherein the switching unit has at least three switching unit outputs, each connected to one of the at least three separate process chambers; wherein said control unit generates control signals for providing said direct current and control signals for selectively outputting said alternating current output signal in response to power requirements of said at least three process chambers and in response to process data about processes in said at least three process chambers, wherein the control signals are coordinated such that at the respective switching unit outputs which are connected to the process chambers, the power corresponding to the power requirements is in substance made available as pulses over time, wherein the pulses for the process chambers are temporally offset from each other, while the process chambers are operated simultaneously.

In the method, the switching unit may have at least three switching unit outputs, one of which is connected to an absorber capable of receiving and absorbing electrical power, and wherein the control unit is configured to monitor the processes in the respective process chambers and detect the occurrence or risk of arcing or an arc event in one of the process chambers, and in response thereto redirect the output signal into the absorber over a pulse duration or at least a portion thereof rather than into a corresponding one of the process chambers.

In one embodiment of the method, the control unit coordinates the sum of pulse duration and a corresponding pulse pause at the respective switching unit outputs in such a way that the sum is equal in each case or that the sum at one of the switching unit outputs is a multiple of the sum at another switching unit output.

In a further embodiment, the method is for the pulsed provision or electrical power having a predetermined frequency of at least 40 KHz to at least three separate process chambers, and comprises the following further steps: providing a direct current having a predetermined voltage and/or intensity at an input of an additional switching unit responsive to a control signal from the control unit; forming, from said direct current, an alternating current output signal having a predetermined frequency of at least 40 KHz in said additional switching unit and, in response to a control signal from said control unit, selectively outputting said alternating current output signal as a pulse having a predetermined pulse duration at one of at least three switching unit outputs of said additional switching unit, each of which is connected to one of said at least three separate process chambers; wherein the control unit, responsive to power requirements of the at least three process chambers and responsive to process data about processes in the at least three process chambers, generates control signals for providing the direct current and control signals for selectively outputting the alternating current output signal, wherein the control signals are coordinated such that at the respective switching unit outputs, which are connected to the process chambers, the power corresponding to the power requirements is in substance available as pulses over time, wherein the pulses which are output by one of the switching units are offset in time with respect to each other, while the pulses of the two switching units may overlap in time.

BRIEF DESCRIPTION OF THE DRAWINGS

The invention will be explained in more detail herein below with reference to the drawings; the drawings show:

FIG. 7 schematic representations of exemplary pulse sequences output by a plasma generator according to FIG. 3, wherein the two representations arranged one above the other show the output at different switching units of the plasma generator;

FIG. 8 schematic representations of pulse sequences, wherein (A) shows a pulse sequence request of process chambers and (B) an exemplary pulse sequence which is output in response to the pulse sequence request by the plasma generator according to FIG. 2;

FIG. 9 schematic representations of pulse sequences, wherein (A) shows a pulse sequence request of process chambers and (B) an exemplary pulse sequence output in response to the pulse sequence request by the plasma generator according to FIG. 2;

FIG. 10 schematic representations of pulse sequences, wherein (A) shows a pulse sequence request from process chambers and (B) an exemplary pulse sequence output in response to the pulse sequence request by the plasma generator according to FIG. 2.

DESCRIPTION

In the present description, the expression in substance shall include deviations of +/−5%, preferably +/−2%, from the given value. Terms such as control unit, controller and controlling as used herein typically refer to a closed loop control unit/controller or closed loop controlling or regulating but may also refer to open loop control unit/controller/controlling.

Figure 1:
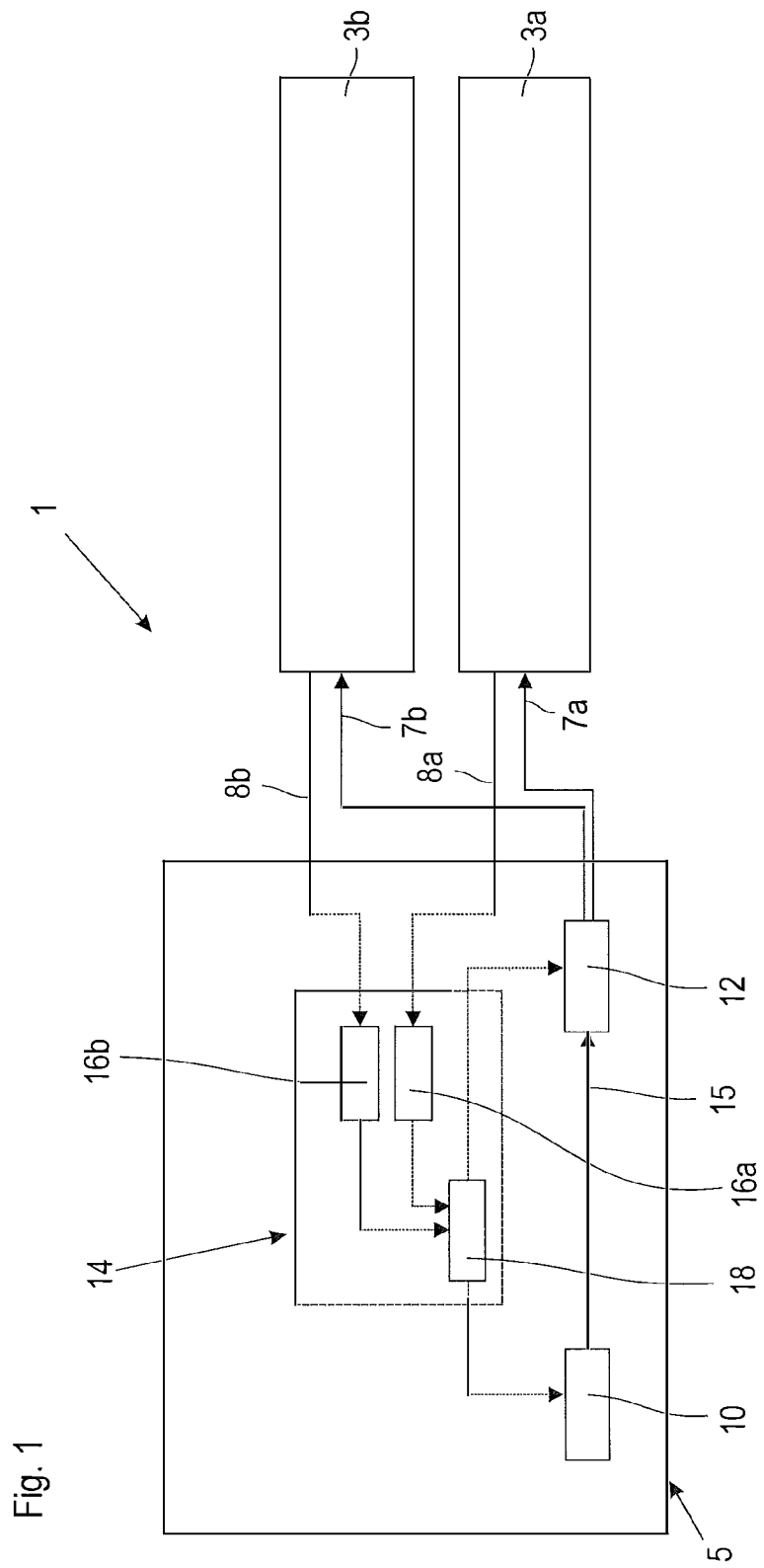
FIG. 1 a schematic representation of a plasma treatment device having a plasma generator according to the invention.

FIG. 1 shows a schematic representation of a first embodiment of a plasma treatment device 1 having two process units 3a, 3b and a plasma generator 5. The process units 3a and 3b can each have the same structure and each have a process chamber for accommodating one or more substrates, in particular semiconductor wafers or PV substrates. The process chambers can be sealed tightly and the process units 3a and 3b have separate means—not shown—for setting a desired gas atmosphere within the respective process chambers, such as pumps and a gas cabinet. While each process chamber is usually assigned its own pump, a gas cabinet can supply several process chambers. The process chambers also contain means for generating a plasma, which in part can be formed by a wafer boat, which for example is introduced into the process chamber together with the substrates and electrically contacted therein, as for example described in the above-mentioned DE 10 2015 004 419 A1, which in this respect is incorporated into the present disclosure.

The process units 3a, 3b are connected to the plasma generator 5 via power lines 7a or 7b and data connections 8a or 8b. The plasma generator delivers 5 electrical power at a frequency of at least 40 KHz via the power lines 7a, 7b to the respective process units 3a and 3b. Data can be exchanged between the process units 3a, 3b and the plasma generator 5 via the data connections 8a and 8b. The data connections 8a and 8b, respectively, can be wired or wireless. In particular, the process units 3a, 3b can supply the plasma generator 5 with different process data about processes in the respective process chambers. In particular, actual data can be transmitted regarding the actually incoming electrical power, the presence of a plasma, etc., but also corresponding target data, as is the case with already known plasma treatment devices with a single process unit and a single plasma generator.

The plasma generator 5 has a controllable power supply unit 10, a switching unit 12 as well as a control unit 14. The power supply unit has an input, which is not shown, as well as an output which is connected to an input of the switching unit 12 via a power line 15. The power supply unit 10 is capable of outputting a direct current at its output with a predetermined voltage and/or intensity, as is known in the art, in response to a control signal from the control unit 14.

The switching unit 12 has the already mentioned input connected to the power supply 15 for receiving direct current from the power supply 10, as well as two separate outputs, wherein one output is connected to the power line 7a and the other output is connected to the power lines 7b. The switching unit 12 has a converter circuit which can convert a direct current at the input into an alternating current having a predetermined frequency of at least 40 KHz as an output signal. For example, the converter circuit may comprise a bipolar transistor which forms a quasi-sinusoidal signal (stepped signal) from the direct current supplied by the power supply 10. Furthermore, the switching unit 12 has a switching part which applies the output signal thus formed, in response to a control signal from the control unit 14, to one or the other output, i.e. to the process unit 3a or the process unit 3b.

The control unit 14, as shown, in turn has two separate controllers 16a, 16b and an arc suppression unit 18. The controllers 16a, 16b are connected to the process units 3a and 3b via the data connections 8a and 8b respectively. The controllers 16a, 16b are each designed to determine performance requirements for the process units 3a, 3b in the known manner on the basis of actual data and target data regarding the respective processes in the process units 3a, 3b. From these data, the controllers 16a, 16b (or a downstream unit) then generate control data for the power supply unit 10 and the switching unit 12. Although the controllers 16a, 16b are shown as separate units, they can also be designed as a single unit, which allows essentially parallel processing of data from the process units 3a and 3b. In particular, the controllers 16a, 16b can be designed as separate software routines that can be executed essentially in parallel and that are executed on one processor.

As shown, the respective outputs of the controllers are connected to respective inputs of the arc suppression unit 18. The arc suppression unit 18 can thus receive the power requirements of the individual process units from the controllers 16a, 16b, or the control data for the power supply unit 10 and the switching unit 12 generated directly from the same. In addition, the arc suppression unit 18 can also receive unprocessed data directly from the respective process units 3a, 3b. Such data are in particular those data which enable the real-time evaluation of whether arcing has occurred in one of the process units 3a and 3b or whether such arcing is imminent. The data required for this are known to the person skilled in the art and also the corresponding detection algorithms, which are therefore not explained in detail here. In the event of the detection of arcing or the danger thereof, the arc suppression unit 18 can adapt the control signals to the power supply unit 10 and the switching unit 12 and briefly interrupt the provision of power to the respective process units 3a, 3b in which the arcing occurs or a respective danger exists.

The arc suppression unit 18 in this embodiment can also be designed in such a way that it generates control data for the power supply unit 10 and the switching unit 12 when it receives power requirement data from the individual process units. Of course, this is not necessary if these control data are already generated by the controllers 16a, 16b. In addition, the arc suppression unit 18 is designed in such a way that it coordinates the control data for the power supply unit 10 and the switching unit 12 that it has created itself or that has been created by the controllers 16a, 16b. The control data for the power supply unit 10 and the switching unit 12 are to be coordinated in such a way that power is made available to the respective process units 3a, 3b according to their power requirements. In addition, the control data for the power supply unit 10 and the switching unit 12 are also to be coordinated in terms of time, since power can only be made available at one of the outputs of the switching unit at any time. As already explained above, the power is provided to the respective process units 3a, 3b as a pulse with a predetermined pulse duration. The respective pulses are therefore to be coordinated via the control data for the power supply unit 10 and the switching unit 12 in such a way that the pulses do not overlap, although the process chambers can still be operated at the same time.

Figure 2:
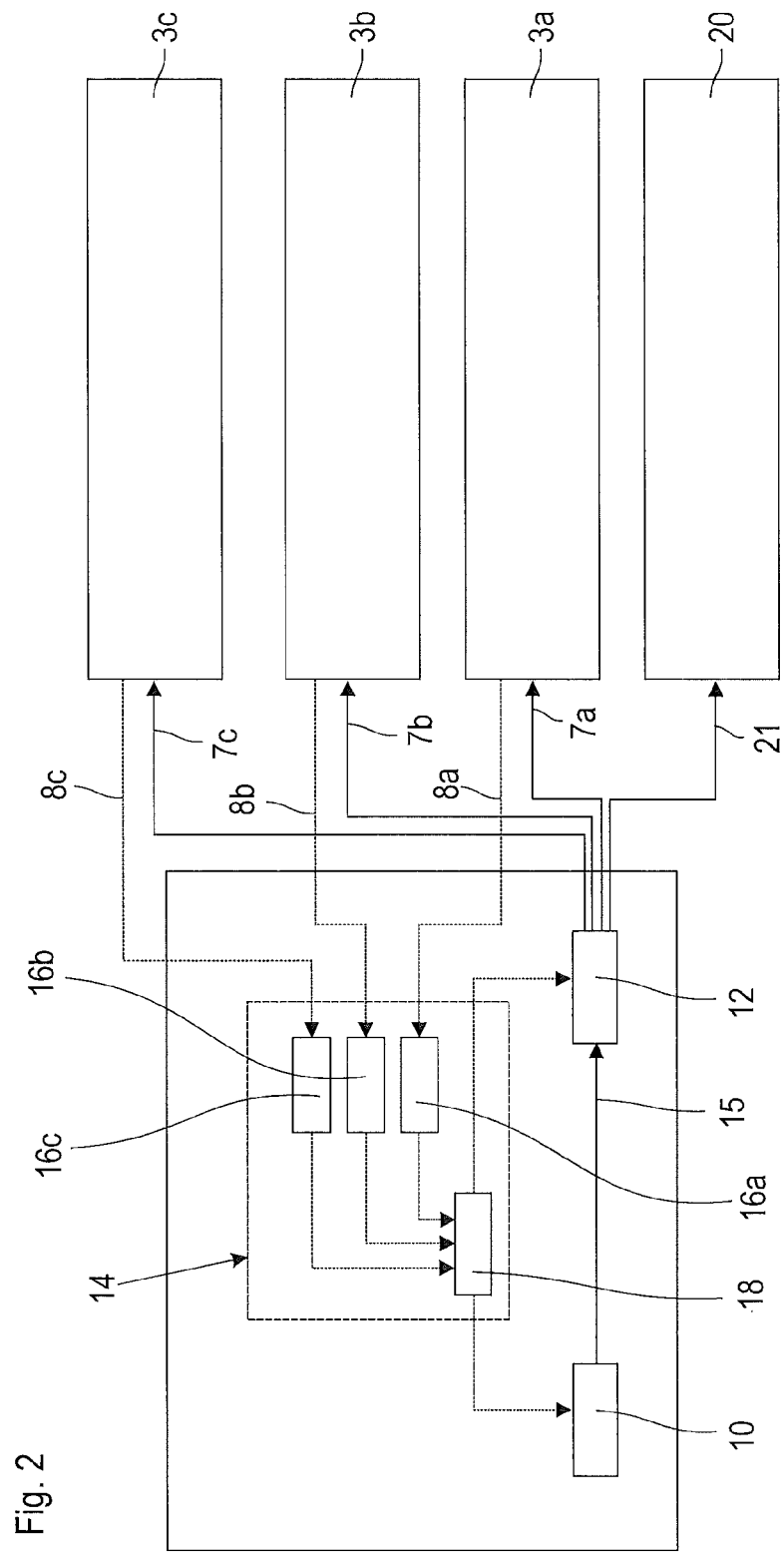
FIG. 2 a schematic representation of an alternative plasma treatment device having an alternative plasma generator according to the invention.

FIG. 2 shows a schematic representation of an alternative embodiment of a plasma treatment device 1, which in this embodiment has three process units 3a, 3b, 3c, one absorber 20 and a plasma generator 5. Where identical or similar elements are present in the different designs, the same reference signs are used.

The process units 3a, 3b and 3c can be identical to those described above and are connected to the plasma generator 5 via power lines 7a, 7b and 7c respectively and data connections 8a, 8b and 8c respectively. The power lines 7a, 7b, and 7c again serve to supply electrical power having a frequency greater than 40 KHz from the plasma generator 5 to the respective process units 3a, 3b and 3c. Via the data connections 8a, 8b and 8c, data can again be exchanged between the process units 3a, 3b, 3c and the plasma generator 5.

The plasma generator 5 again has an adjustable power supply unit 10, a switching unit 12 and a control unit 14. The power supply unit 10 can be identical to the one described above. The switching unit 12 again has an input connected to the output of the power supply unit via the power line 15. In this embodiment, however, the switching unit has four separate outputs, three of which are connected to the power lines 7a, 7b or 7c while the fourth output is connected to the absorber via a power line 21.

The switching unit 12 again has a converter circuit, as described above, as well as a switching part which selectively applies an output signal formed by the converter circuit, in response to a control signal from the control unit 14, to one of the outputs. Therefore, the output signal can be selectively applied to one of the process units 3a to 3c or to the absorber 20.

The control unit 14 in this embodiment has three separate controllers 16a, 16b and 16c as well as an arc suppression unit 18. The controllers 16a, 16b and 16c are connected to the process units 3a, 3b and 3c via data connections 8a, 8b and 8c respectively. The controllers 16a, 16b and 16c can again be of the type described above which is designed to determine power requirements for the respective process unit 3a, 3b or 3c and, if necessary, also control data for the power supply unit 10 and/or the switching unit 12.

The arc suppression unit 18 can also be essentially of the type described above, but in this embodiment it monitors three process units 3a, 3b and 3c with regard to the risk of arcing. In addition, it coordinates the pulses provided by the switching unit 12 for three process units 3a, 3b and 3c.

The arc suppression unit 18 in this embodiment can also be designed to generate control data for the power supply unit 10 and the switching unit 12 when it receives power requirement data from the individual process units. Of course, this is not necessary if these control data are already generated by the controllers 16a, 16b, 16c.

In addition, the arc suppression unit 18 is designed in such a way that it coordinates the control data for the power supply unit 10 and the switching unit 12 that it has created itself or that has been created by the controllers 16a, 16b, 16c. The control data for the power supply unit 10 and the switching unit 12 are to be coordinated in such a way that power is made available to the respective process units 3a, 3b and 3c according to their power requirements. In addition, the control data for the power supply unit 10 and the switching unit 12 are also to be coordinated in terms of time, since power can only be made available at one of the outputs of the switching unit at any one time. As already explained above, the power is supplied to the respective process units 3a, 3b and 3c as a pulse with a predetermined pulse duration. Therefore, the respective pulses are to be coordinated via the control data for the power supply unit 10 and the switching unit 12 in such a way that the pulses do not overlap, while the process chambers can still be operated simultaneously.

Although the arc suppression unit 18 is shown as a single unit that performs both the arc suppression function and the pulse coordination function, these functions can also be performed in separate units. For an arc suppression function, the evaluation of the process data and the control data for each of the process chambers could be carried out separately and accordingly three units could be provided (e.g. as separate software routines running in parallel). If the arc suppression function detects arcing or the danger of arcing, it can redirect the pulse actually prepared for one of the respective process units 3a, 3b and 3c to the absorber 20 instead of directing it to the respective process unit 3a, 3b and 3c, wherein the absorber is capable of absorbing the power pulse and, for example, converting it into heat. Such a switching can be done for a whole pulse or also for a partial pulse, as will be explained in more detail below.

For the pulse coordination function, the data, in particular the power requirement data of the individual process units or the desired control data for the power supply unit 10 and the switching unit 12 have to come together in a coordination routine. As already mentioned, this can take place in the arc suppression unit 18 or in a separate pulse coordination unit. In the coordination routine, the power requirement data of the individual process units determined by the controllers or the resulting control data for the power supply unit 10 and the switching unit 12 are brought together and checked for conflicts. During this check, data about the power supply unit 10 and the switching unit 12, such as switching times, maximum power, maximum pulse duration (if limited) are also taken into account. Further data on the respective process units 3a, 3b and 3c and the running processes can also be taken into account. Such data can for example contain time tolerances for pulse application, tolerances with regard to pulse amplitude, the minimum required and/or the maximum permitted energy input into the process as well as other parameters if necessary. These data can be constant or may change over the course of a process. For example, there are processes in which exact pulse sequences with a fixed pulse length and with fixed pulse amplitudes must be maintained at certain times, while at other times of the process the pulse length and also the pulse amplitude are quite flexible, while the energy input over time lies within narrow tolerances.

Using these data, the coordination unit can then coordinate the output pulses at the outputs of the control unit. Preferably, processes are carried out in the respective process units 3a, 3b and 3c which allow for one of the processes the setting of a pulse length (sum of pulse duration and pulse pause) which is the same or an integer multiple of the pulse length of the other processes. This simplifies the coordination considerably, as will be explained in more detail below on the basis of the pulse diagrams, but it is not mandatory. Different coordination possibilities are explained in more detail in the following using the pulse diagrams.

Figure 3:
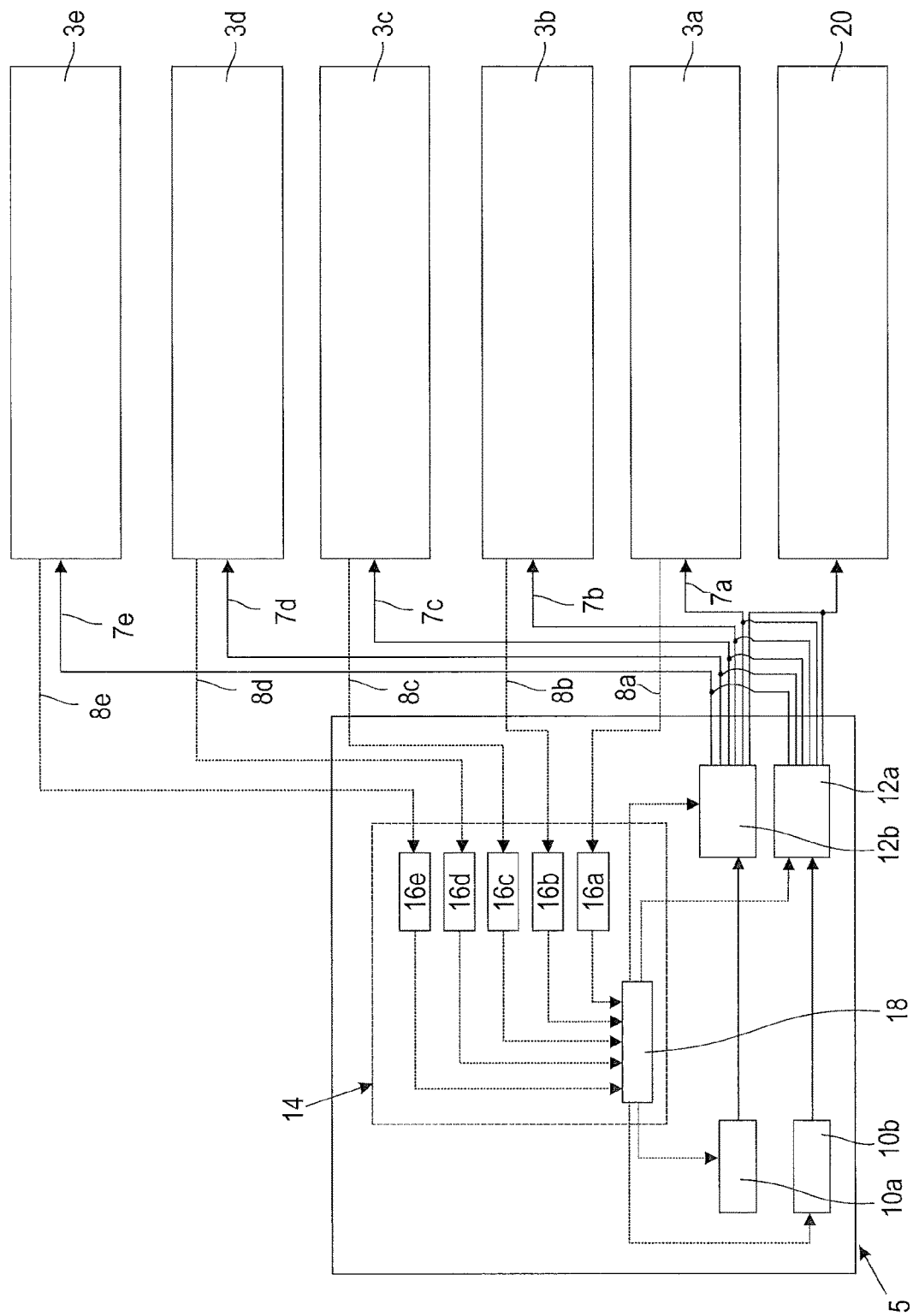
FIG. 3 a schematic representation of another alternative plasma treatment device having another alternative plasma generator according to the invention.
Figure 4:
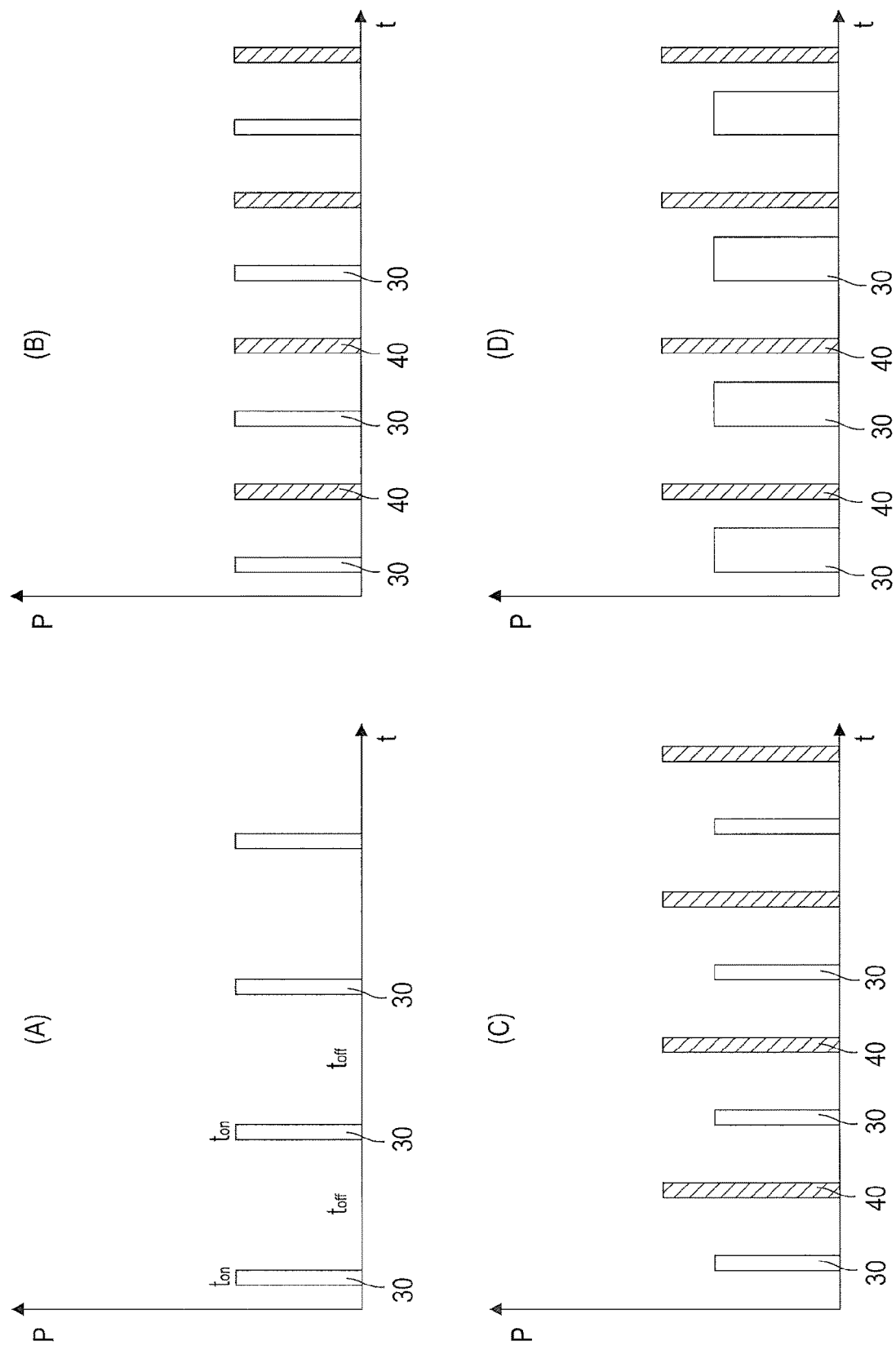
FIG. 4 schematic representations of pulse sequences output by a plasma generator, wherein (A) shows a normal pulse sequence of a common plasma generator, while (B) to (D) show different exemplary pulse sequences emitted by a plasma generator according to FIG. 1.
Figure 5:
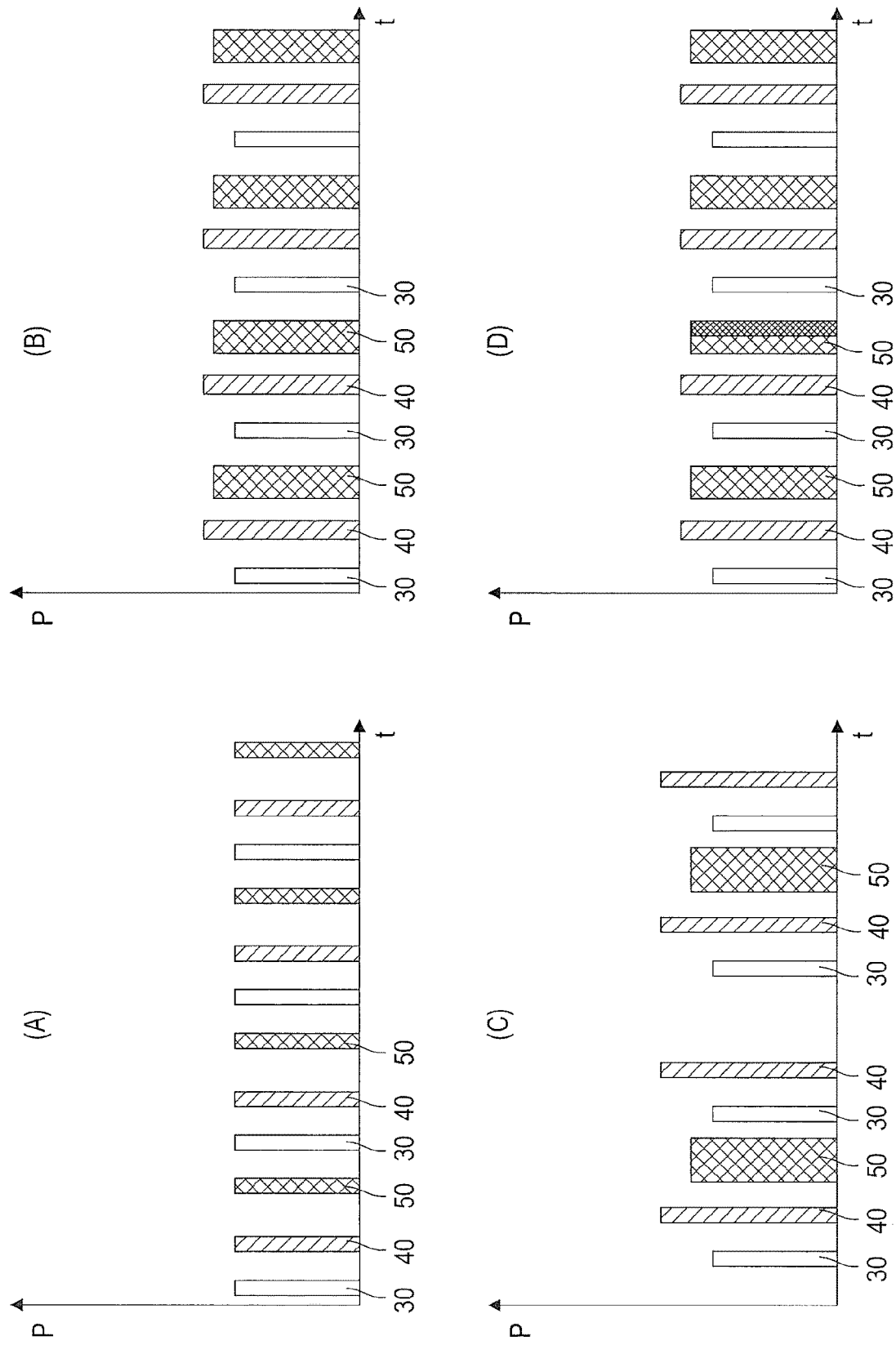
FIG. 5 schematic representations of pulse sequences, where (A) to (D) show different exemplary pulse sequences output by a plasma generator according to FIG. 2.

FIG. 3 shows a schematic representation of another alternative embodiment of a plasma treatment device 1. In this embodiment, five process units 3a to 3e, an absorber 20 and a plasma generator 5 are provided. Where the same or similar elements are present in the different embodiments, the same reference signs are again used.

The process units 3a to 3e can be identical to those described above and are connected to the plasma generator 5 via power lines 7a to 7e and data connections 8a to 8e. The power lines 7a to 7e are again used to supply electrical power having a frequency greater than 40 KHz from the plasma generator 5 to the respective process units 3a to 3e. Via the data connections 8a, 8b and 8c, data can again be exchanged between the process units 3a, 3b, 3c and the plasma generator 5.

In this embodiment the plasma generator 5 has two controllable power supplies 10a, 10b, two switching units 12a, 12b and one control unit 14. The power supply units 10a, 10b can be identical to the power supply unit described above. The power supplies 10a, 10b can be identical or different with regard to the rated power. The switching units 12a, 12b each have an input which is connected via a power line 15a or 15b to the output of one of the power supplies. In this embodiment, the switching units 12a, 12b each have six separate outputs, wherein five of the outputs are each connected to the power lines 7a to 7e and thus to the plasma units 3a to 3e while the sixth output is connected to the absorber 20 via a power line 21.

The switching units 12a, 12b each have a converter circuit as described above as well as a switching part which selectively applies an output signal formed by the converter circuit, in response to a control signal from the control unit 14, to one of the outputs. Thus, the output signal of each switching unit 12a, 12b can be selectively applied to one of the process units 3a to 3e or to the absorber 20.

In this embodiment, the control unit 14 now has five separate controllers 16a to 16e, as well as an arc suppression unit 18. The controllers 16a to 16e are connected to the process units 3a to 3e via respective data connections 8a to 8e. The controllers 16a to 16e can in turn be of the type described above which is designed to determine power requirements for the respective process unit 3a to 3e and potentially also control data for the power supply unit 10 and/or the switching unit 12.

The arc suppression unit 18 is configured to monitor the five process units 3a to 3e for the risk of arcing in this embodiment. Furthermore, it is configured to distribute and coordinate the required pulses for the plasma units 3a to 3e via both power supplies 10a, 10b and both switching units 12a, 12b.

The fact that the arc suppression unit 18 can distribute the required pulses to two power supplies (combination of power supply and switching unit) results in considerably greater flexibility with regard to the distribution of the pulses. In particular, overlapping pulses can now also be made available if this is necessary due to the power requirements, as will be explained in more detail below. A respective coordination requires that at each switching unit 12a or 12b the pulses are provided sequentially, but the switching units 12a, 12b can be controlled in such a way that they simultaneously provide pulses. If the pulses are provided simultaneously via the separate switching units 12a, 12b, however, they are to be applied to separate plasma units 3a to 3e.

Although the arc suppression unit 18 is represented as a single unit that performs both the arc suppression function and the pulse coordination function, these functions can also be performed in separate units. In particular, if coordination becomes more complex and may interfere with the arc suppression function, the pulse coordination function could be performed in a separate unit.

The plasma generator 5 is also shown as a single plasma generator with two separate power supplies. Of course, two separate plasma generators 5 could also be provided here, which are connected to the plasma units 3a to 3e and the absorber respectively, and which are coordinated accordingly via a common control unit. However, a single unit is preferred as the communication between arc suppression unit 18 and the power supply(s) 10a, 10b and the switching unit(s) 12a, 12b runs via real-time data connections, which are mechanically sensitive and should preferably not be routed outside the respective unit.

As the person skilled in the art can see, the number of plasma units to be supplied and the design of a plasma generator are not limited to the specific embodiments as shown. For example, even more plasma units could be supplied by the plasma generator shown in FIG. 3. It is also possible, for example, to provide three power supplies in the plasma generator for a larger number of plasma units, whereby the complexity of pulse coordination increases with the increasing number of process chambers and power supplies. According to the invention, however, the number of plasma units should be higher than the number of available power supplies and, in particular, at least twice as high.

For example, a plasma treatment device with eight plasma units (+1 optional absorber) and a plasma generator with two separate power supplies, as shown in FIG. 3, or with two separate plasma generators and a common control unit, is currently being considered.

For the pulse coordination function, the same data as described above can come together in this embodiment.

FIGS. 4 to 7b show different exemplary pulse sequences that can be provided via a plasma generator 5 according to the invention.

FIG. 4A shows a classical pulse sequence, which already has been provided by plasma generators in the past. An alternating current pulse 30 having a frequency of at least 40 KHz and a predetermined intensity or power (P) is output for a predetermined period of time ton of for example 5 ms. Then follows a pulse pause toff of for example 45 ms followed by another pulse with a duration ton of for example 5 ms. This is a typical sequence of power pulses provided for plasma treatment in a plasma unit. This results in a cycle duration of 50 ms and a duty cycle of 0.1. Thus, for example, 90% of the available continuous power of the used plasma generator remains unused.

FIG. 4B shows an alternative pulse sequence which can for example be provided by a plasma generator according to the invention, as for example shown in FIG. 1. The exemplary pulse sequence consists of pulses 30 and 40, wherein for example the pulses 30 are made available to the process unit 3a and the pulses 40 to the process unit 3b. In this pulse sequence, the pulses 30 and 40 each have the same power and the same pulse duration ton of for example 5 ms. Between the pulses 30-30/40-40 for the respective process unit 3a/3b there is a pulse pause toff of for example 45 ms. Between the pulses 30-40-30 there is a pulse pause toff of for example 20 ms. While each individual process unit 3a, 3b is operated with a duty cycle of 0.1, the plasma generator is operated with a duty cycle of 0.2 and is therefore much better utilized.

FIG. 4C shows another exemplary pulse sequence that can be provided by a plasma generator according to the invention as for example shown in FIG. 1. The exemplary pulse sequence again consists of pulses 30 and pulses 40, wherein for example the pulses 30 are made available to the process unit 3a and the pulses 40 to the process unit 3b. In this pulse sequence, however, the pulses 30 and 40 each have a different power but again the same pulse duration ton of for example 5 ms and also the same pulse pauses, as in FIG. 4B. Here it shall be shown that the plasma generator is not only able to nest the same pulses but also to provide pulses with different power, which is possible for example by respective control of the power supply 10.

FIG. 4D shows another exemplary pulse sequence that can be provided by a plasma generator according to the invention as for example shown in FIG. 1. The exemplary pulse sequence again consists of pulses 30 and pulses 40, wherein for example the pulses 30 are made available to the plasma unit 3a and the pulses 40 to the process unit 3b. In this pulse sequence, the pulses 30 and 40, as in FIG. 4C, each have a different power and this time also a different pulse duration ton of for example 15 ms for the pulses 30 and 5 ms for the pulses 40. The pulse pauses between the pulses 30-40 are for example 10 ms each and between the pulses 40-30 are for example 20 ms each. As can be seen, the pulses for plasma processes that are pulsed with the same cycle length (or with cycle lengths that are a multiple of each other) can be easily interleaved and provided with a single plasma generator.

But also processes pulsed with different cycle lengths, which are not multiples of each other, can be supplied by a single plasma generator. Since a pulse can only be provided for one plasma unit at a time, a temporal pulse shift of one and/or the other pulse, or a splitting and partial shifting of a pulse can be used for this purpose, as will be explained in more detail below with reference to FIG. 6. Hereby one tries to meet the requirements of the respective plasma unit, so that, for example, shifts/partitions only occur within permissible tolerances. An appropriate control unit for controlling a power supply (combination of power supply unit and switching unit) can evaluate respective data and, if necessary, also look one or more cycles ahead in order to recognize when conflicts between pulses are to be expected and, if necessary, prepare shifts. If, for example, a maximum pulse pause toff in a process—having a normal pulse pause of 45 ms—is 50 ms, but a shift of +10 ms is required in two cycles, a +5 ms shift can occur in two consecutive cycles, so that a 50 ms pulse pause occurs in two consecutive cycles. However, shifts should preferably be selected in such a way that an energy input into the process corresponds to the power requirements over longer cycle of, for example, 50 cycles or remains unchanged over time.

FIGS. 5A to 5D show different exemplary pulse sequences that are provided, for example, by a plasma generator 5 according to FIG. 2. Here, for example, three different pulses 30, 40, 50 are provided for different process units 3a to 3c.

FIG. 5A shows a pulse sequence with pulses 30, 40, 50, each of which has the same pulse duration ton of, for example, 5 ms and the same intensity or power. Between the pulses 30-30/40-40/50-50 for the respective process unit 3a/3b/3c there is a pulse pause toff of for example 45 ms. Between the pulses 30-40-50-30 there are pulse pauses toff of for example 10 ms-15 ms-10 ms. While each individual process unit 3a, 3b is operated with a duty cycle of 0.1, the plasma generator is now operated with a duty cycle of 0.3.

FIG. 5B also shows a pulse sequence with pulses 30, 40, 50, which differ, however, with respect to their pulse durations ton and also with respect to their power. However, the pulses 30-30/40-40/50-50 each have the same cycle length of for example 50 ms, so that the pulses are easy to interleave.

FIG. 5C shows another exemplary pulse sequence similar to FIG. 5B with pulses 30, 40, 50, which differ in their pulse durations ton and also in their power. In addition, the pulses 30-30/40-40 each have the same cycle length of for example 50 ms, while the pulses 50-50 have a cycle length twice as long, for example 100 ms. Here, too, the pulses can easily be interleaved.

FIG. 5D shows another exemplary pulse sequence similar to FIG. 5B with pulses 30, 40, 50, which differ in their pulse durations ton and also in their power, but the pulses 30-30/40-40/50-50 each have the same cycle length again. However, this pulse sequence shows an example of the intervention of the arc suppression unit 18 in the regular pulse sequence. During the first half of the second pulse 50 an arc was detected in the plasma unit 3c, whereupon the arc suppression unit 18 controlled the switching unit 12 in real time to divert the second half of the pulse 50 into the absorber. This is possible quickly and no power fluctuations are generated in the subsequent pulses, which could occur with a simple separation of the plasma unit 3c from the plasma generator 5, since the power is already provided in the switching unit.

Figure 6:
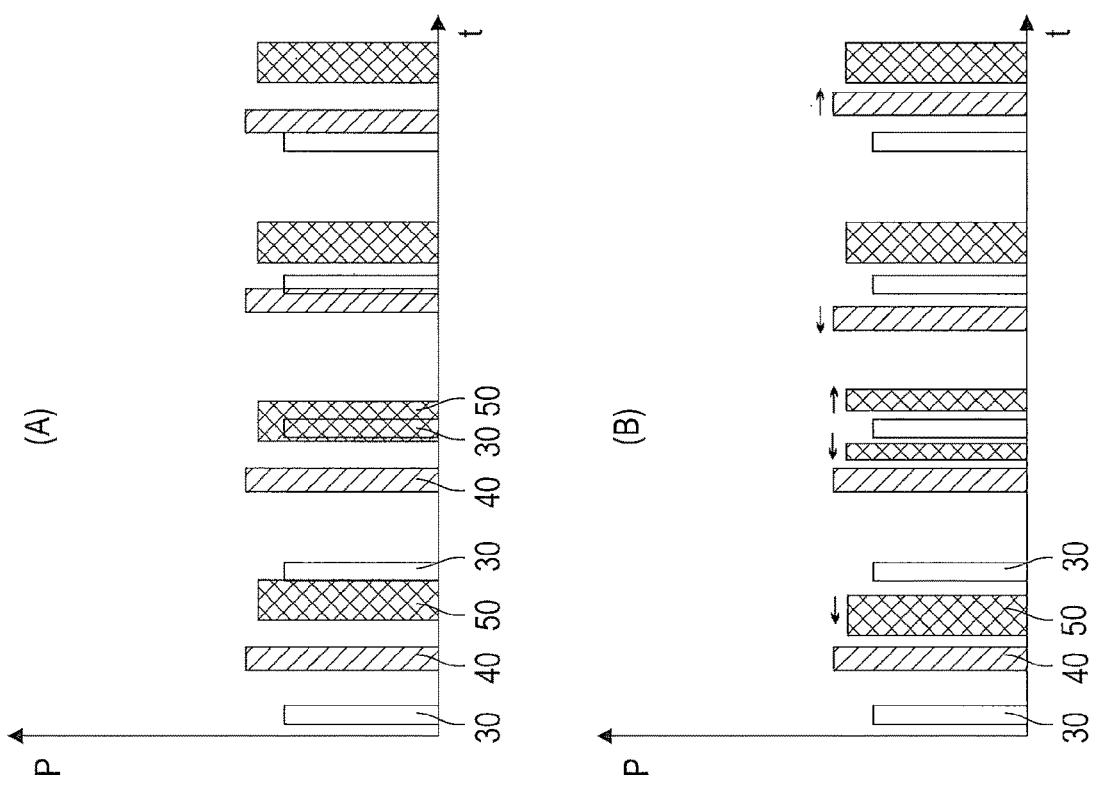
FIG. 6 schematic representations of pulse sequences, wherein (A) shows a pulse sequence request of process chambers and (B) an exemplary pulse sequence which is output in response to the pulse sequence request by the plasma generator according to FIG. 2.

FIG. 6 shows at (A) an exemplary pulse sequence request (power requirement) of three process chambers, which is, for example, to be processed and coordinated by the arc suppression unit 18 according to FIG. 2, and at (B) an exemplary pulse sequence, which is delivered by the plasma generator according to FIG. 2 in response to the pulse sequence request.

As can be seen in FIG. 6A, pulses 30, 40, 50 with different pulse durations and different powers are requested, whereby a corresponding request or requirement profile is created, for example, by the controllers 16a to 16c. In addition, the pulses 30-30/40-40/50-50 also have different cycle lengths, so that the pulse sequence request requests pulses partly overlapping or directly one after the other.

Since this is not possible, the arc suppression unit 18 or another control unit must now coordinate the pulses to be output in such a way that they are output in a suitable manner, whereby the requirements of the plasma units are taken into account as far as possible. In the example given in FIG. 6, it was assumed that the pulses 30 must not be changed at all, since the corresponding plasma unit does not allow any deviations at least during the current phase of the process. Thus the output pulses 30 (see FIG. 6B) correspond exactly to the requested pulses. The processes in the plasma units 3b and 3c, on the other hand, allow deviations of the pulses within predefined limits as long as the total energy input remains constant over time. Therefore, the first pulse 50 in FIG. 6B is slightly shifted forward in time compared to its request (which is directly adjacent to a pulse request for a pulse 30) in order to take into account the switching time of the control unit 12 of, for example, 1 ms. The second pulse 50, which would completely overlap with a pulse 30 according to the pulse request, was divided into two parts 50-1, 50-2, where the part 50-1 was shifted in time before the corresponding pulse 30 and the part 50-2 was shifted in time after the pulse 30. Hereby the sum of the duration of the partial pulses 50-1, 50-2 corresponds to the duration of a normal pulse 50. In addition to such a division, it would also have been possible to shift the pulse 50 completely behind the pulse 30 if a maximum pulse pause between pulses 50-50 had not been exceeded. The third and fourth pulses 40 were also shifted in time to enable a proper pulse sequence. If none of the overlapping pulses necessarily has to occur at a certain point in time, also both overlapping pulses can be shifted, wherein the shift will then usually be in opposite directions. While one is shifted forward, the other is shifted backward. This allows the required pulse pauses between the same pulses of a chamber to be better maintained.

FIG. 6 shows different possibilities of how pulse sequences can be created on the basis of determined power requirements and the needs of the plasma units. The expert will recognize from the basic teaching of the invention different concepts for the coordination of the pulses, which as indicated above can also be predictive.

Next to, or in addition to, shifting and/or splitting the pulses, it is also possible to change the respective pulse height and/or pulse duration. An example of this is shown in FIGS. 8 (A) and (B). FIG. 8(A) again shows an exemplary pulse sequence request (power request) of three process chambers, while FIG. 8 (B) shows an exemplary pulse sequence output. In particular, the pulse sequence request is the same as in FIG. 6(A) and again the pulses 30 are regarded as not allowed to change. However, the pulse sequence output according to FIG. 8(B) differs from that according to FIG. 6(B). As such, the first pulse 50 was not shifted forward in time as in FIG. 6(B). Rather, the beginning of the pulse corresponds to the request. However, the pulse was shortened in time, but increased in power. Thus, a higher power was provided during the short period of time, so that the total power of the pulse is equal or approximately equal to the requested power. The second pulse 50 was not split but shifted after the overlapping requested pulse 30. At the same time, the pulse was shortened in time and the power increased, as with the first pulse 50. This can be advantageous over a division, for example, to maintain minimum pulse pauses between successive pulses of a chamber. The third pulse 40 was treated similarly to the first pulse 50, i.e. the requested starting time was maintained, while the pulse duration was shortened and the pulse height increased. At the fourth pulse 40 the start time was shifted, but the end time was kept as requested. This again shortens the pulse duration, which was compensated by increasing the pulse height. FIG. 8(B) thus shows an alternative pulse management, which fully copes without a pulse shift while having the same starting situation as FIG. 6(A). A pulse shift here is defined as a shift of both the start time and the end time with respect to the request. If at least one of the times occurs according to the request, this is not regarded as a shift.

Based on FIG. 8, the person skilled in the art can see that there are further concepts for the coordination of the pulses in addition to the shift and the division of pulses. Of course the concepts can also be mixed with each other—especially it is also possible to shift a pulse as well as to modulate the pulse height and/or the pulse duration.

Even if this is not shown, it is also possible to omit a pulse completely if one of the above measures is not possible or expedient. However, the energy input over time should not be significantly influenced. The term "over time" can be relatively short, depending on the process, if, for example, a minimum energy input per unit of time (e.g. millisecond) must not be undershoot, since the respective unit of time must be taken into account here. However, the term can also cover the entire process itself, if, for example, it essentially depends on the total energy input into the process. In the case of short periods of time, in the case of a total or partial failure of a pulse, for example the previous and/or subsequent pulse could be increased or extended accordingly. For longer periods of time, pulses may also be delivered much later, for example after a planned end of a process. The pulse management is configured such that, taking into account the capabilities of the components used, such as power supply 10 and/or switch 12 it selects the optimal configuration of pulse duration, pulse shift, pulse power magnitude and/or pulse division for various requirements of the chambers. The optimum configuration is considered to be one with the lowest possible process influence. To improve a constant energy input, it can also be expedient to change not only temporally overlapping or adjacent pulses.

The pulse management can, for example, be implemented as separate hardware or integrated into the control unit, especially the controllers.

FIG. 7 shows exemplary pulse sequences as they are output by switching units 12a, 12b of a plasma generator according to FIG. 3, wherein the two diagrams arranged one above the other show the output at different switching units 12a, 12b of the plasma generator.

Pulses 30, 40, 50 having the same pulse duration, cycle length between the same pulses and the same power are to be supplied as power requirements, which, for example, a applied to the three plasma units 3a to 3c in which the same processes take place at the same time. In addition, pulses 60 and 70 are also to be generated for the plasma units 3d and 3e, the pulses having different pulse durations, pulse cycles and powers, wherein each pulse 70 overlaps one of the pulses 60 in time. The requirements of the plasma units 3d and 3e do not allow any shifts.

Here, the control unit has now found a division of the pulses in which the switching unit 12a primarily outputs the pulses 30, 40, 50, while the switching unit 12b primarily outputs the pulses 60 and 70. However, since the switching unit 12b must not shift the pulses 60 and 70, but there is an overlap with regard to the requirement each time the pulse 70 is to be output, the required pulse 60 is output via the switching unit 12a at the time the pulse 70 is output via the switching unit 12b. In the representation according to FIG. 7 this is possible without shifting the pulses 30, 40 and 50. However, if necessary, space can also be created between pulses 30, 40 and/or 50 to allow for pulse 60, provided that the requirements of plasma units 3a to 3c do not conflict with this.

As can be seen, the plasma generator 5 according to FIG. 3 offers great flexibility with regard to the generation of pulse sequences to meet the performance requirements of a large number of plasma units taking into account the respective requirements. In the following, further special pulse management variations will be explained in more detail.

Pulse Shift with Pulse-Off-Time-Analysis

In the following, the concept of pulse shifting with pulse-off-time analysis is introduced, where the shifting of a pulse may result in a shifting of subsequent pulses for the same chamber (wherein in the following the pulses for a respective chamber are also referred to as pulses of a channel). The following rules apply:

a. Pulse length and pulse height must not be changed.
b. Pause times between pulses are minimum times, but can be extended if necessary.
c. The first requested pulse is output first, the pulse for the other channel must wait and is then output completely. The resulting pulse-off-time extension (extended pause time between the preceding pulse and the shifted pulse) is not subtracted from the next pulse-off-time. Consequently, subsequent pulses are shifted back in time by the pulse-off time extension.
d. If two pulses are requested at exactly the same time, first the shorter pulse and then the longer pulse is output. If these are equal, the pulse on the first channel should be output first. If several channels are present, they are output in a defined sequence.
e. The shift of the pulses leads to an increase of the pulse-off-time over a period of time. A moving average value is to be formed from this. This value indicates how much longer the total pulse-off-time is on average over time. In the following we call this pulse-off-time-increase.

FIGS. 9(A) and (B) show this concept using a system with two chambers (channels), wherein FIG. 9(A) shows a pulse request and FIG. 9(B) shows a corresponding pulse output. As shown in FIG. 9(A), the third and fourth requested pulses 30 and 40 overlap, with the pulse 30 starting before the pulse 40 for the third pulses and the pulse 40 starting before the pulse 30 for the fourth pulses. As shown in FIG. 9(B), with respect to the third pulses, the pulse 30 is output first followed by the pulse 40. For the fourth pulses, the pulse 40 is output first followed by the pulse 30. The fourth pulse 40, however, is shifted backwards in time by the same amount as the third pulse was shifted backwards, so that the pause time between the third and fourth pulse does not fall below the requested pause time (minimum pause time). Therefore the shift of one pulse causes a shift of subsequent pulses.

An advantage of this approach is that it is not necessary to deduct the resulting waiting time of the subordinate pulse from the pause time. This prevents unwanted feedback. However, over time, this approach can lead to a pulse-off-time-increase, i.e. a reduced power output. In order to counteract this, various measures are possible, such as an extension of the entire process time in the affected chambers corresponding to the moving average value. Further exemplary measures are explained below.

Pulse Shift with Pulse-Off-Time-Correction

In order to compensate for the increased pulse-off time over a period of time, the above rules from a. to e. can be supplemented by the following rule.

f. The user must enter a correction value that reduces the waiting time of the pulses by a fixed value. The value is selected by the user based on the determined moving average value and there is no feedback during the process. This is shown in the following formula.

pulse-off-timepulse $X$=set pulse-off-timepulse $X$–correction value

If, for example, the moving average results in an average extension of the pulse-off time by 2%, the correction value can be set accordingly. In the case of 2%, for example, a correction value of 1 μs can be entered for a set pulse-off time of 50 μs. This value is then permanently used during the process.

Pulse Shift with Pulse-Off-Time-Correction

Another approach to compensate for the increased pulse-off-time over a period of time is the calculation of a relative value. Therefore, the rules a. to e. can be supplemented by the following rule.

g. A correction value in percent is entered, which reduces the pause time between successive pulses by a randomly distributed percentage between 0% and the entered correction value. For example, for 10% and a set pulse-off-time of 50 μs, a window of 45 μs to 50 μs for the pause time is provided. The value is selected by the user and there is no further feedback. This is shown in the following formula.

pulse-off-timepulse $X$=adjusted pulse-off-timepulse $X*(100\%-X)$

X is a random value in % between 0% and the set correction value. This is permanently set and used during the process.

Pulse Shift with Pulse-Off-Time-Correction with Feedback

Another alternative approach to compensate for the increased pulse-off-time over a period of time is a compensation with feedback. To make the plasma generator more user-friendly, the correction value is automatically determined, entered and adjusted by integrations. However, in some cases this can lead to undesired oscillations due to feedback. If necessary, algorithms may be used to detect and suppress such possible oscillations.

For this purpose, the above rules a. to e. are supplemented by the following rule.

h. A correction value is determined based on a determined pulse-off-time extension. The pulse-off-time extension is multiplied by a proportional factor K for this purpose.

K can be selected by the user and corresponds for K<1 to an attenuation factor and K>1 to a gain factor. This is illustrated in the following formulas:

Correction value=$K*$pulse-off-time extension pulse-off-time=set pulse-off-time–correction value These formulas can be applied to each pulse.

Pulse Shift with Pulse-Time Conservation

The pulse-time conservation approach is used to avoid power losses and complex correction mechanisms as described above. The following rules are used:
  a. Pulse length and pulse height must not be changed.
  b. Pause times between successive pulses of a channel are flexible and can be shortened or extended if needed.
  c. The first requested pulse is output first, the pulse on the other channel is shifted back in time (the pulse-off-time with respect to the previous pulse in the channel is extended) and is then output completely. Correspondingly, the extension of the pulse-off-time is then subtracted from the pulse-off-time to the next pulse in the same channel so that the following pulse is output with a shortened pulse-off-time.

Therefore, each pulse is output at the request time, unless there is an overlap with a pulse of another channel. The shift of a pulse does not cause a shift of subsequent pulses in the same channel.

Pulse Omission with Priorities

Another approach for the pulse management is to at least partially omit pulses by giving priority to one of the pulses. The following rules may for example apply:
  a. The pulse height must not be changed.
  b. Pause times are fixed and are not to be changed.
  c. The output pulses have a priority list and the important pulse is always output over the unimportant one. The low-priority pulse may be completely omitted or may be output only partially.
  d. The sum of the omitted pulses is determined and results in a pulse-omission-sum.

FIGS. 10(A) and (B) show this concept using a system with two chambers (channels), wherein FIG. 10(A) shows a pulse request and FIG. 10(B) shows a corresponding pulse output. As shown in FIG. 10(A), the third and fourth requested pulses 30 and 40 each overlap. In the example, the pulse 30 has the higher priority so that it is always output as requested, as shown in FIG. 10(B). The third and fourth pulses 40, on the other hand, are output shortened. With the third pulse 40, the start is shifted behind the end of the pulse 30, while the end is maintained according to the requirement profile. 'With the fourth pulse 40 the pulse starts as requested, but ends earlier, especially before the request time (and the output) of the overlapping requested pulse 30.

The (partial) omission of the pulses can significantly reduce the power input, which is why an approach is defined below to counteract this problem.

Pulse Omission with Number-of-Pulses Correction

In an alternative approach to compensate the effect of (partially) omitted pulses according to the "pulse omission with priorities" approach, the corresponding rules a. to d. can be supplemented by the following rule.
  e. Based on the pulse-omission-sum determined in d., the number of omitted pulses is output at the end of the control pulse sequence.

Since the process result is usually strongly dependent on the total power input, a pulse omission—provided this does not cause the process to terminate—can be compensated for by simply extending the process time.

Pulse Omission with Pulse Power and/or Pulse Duration Correction

To counteract the power reduction, the pulse duration and/or the pulse power (height) can be varied, wherein a pulse duration variation includes a deviation from the normal (requested) pulse duration, so that it is not a simple pulse shift. Here the rules a. to d. according to the "pulse omission with priorities" approach can be adapted as follows and supplemented by the following rules:
  a. The pulse height may only be changed within specified limits.
  b. Pause times may be changed within given limits, in particular shortened, if needed.
  c. The output pulses have a priority list and the important pulse is always output over the unimportant one. The low-priority pulse may be completely omitted or may be output only partially.

d. The portion of the pulse that is omitted due to an overlap is determined.
e. Determine—taking into account the pause times—the extent to which the portion of the pulse that is omitted can be compensated for by shifting the pulse start/end and/or by increasing the pulse height within the specified limits.
f. Shift the pulse start/end and/or increase the pulse height within the specified limits.

In this process, the shifting of the pulse start/end can, for example, be given priority over a pulse height increase, so that an attempt is first made to compensate for the omitted portion of the pulse by shifting the same and only then, the remaining portion (if completely possible) is compensated by a pulse height increase. However, the priority can also be set the other way or a weighting function can be set.

Of course, it can also be possible that only a shift of the pulse start/end or a pulse height increase is allowed.

The different approaches mentioned above can be combined as far as they compatible with each other that so the expert will realize different approaches depending on the process requirements.

The invention has previously been described on the basis of preferred embodiments of the invention, without being limited to the specific embodiments. In particular, the plasma generators can be used for a wide variety of plasma units and the number of plasma units to be supplied by a plasma generator can also differ from the number shown. In the design according to FIG. 3 it is also not necessary that the switching units 12a, 12b are both connected to each one of the plasma units 3a to 3e. For example, it would be conceivable that only plasma units 3a to 3c are connected to switching unit 12a and plasma units 3c to 3e to switching unit 12b, so that only plasma units 3c can be supplied by both. This would reduce the flexibility, but still allow the supply of at least one of the plasma units via two switching units in order to solve possible conflicts during pulse sequence generation.

The invention claimed is:

1. A plasma generator for the pulsed provision of electrical power having a frequency of at least 40 KHz to at least two process chambers, the plasma generator comprising:
   a control unit configured to obtain and evaluate process data about processes in the at least two process chambers;
   a controllable power supply having an output, the controllable power supply configured to output a direct current having a predetermined voltage and/or intensity at its output in response to a control signal from the control unit; and
   a switching unit having a first input connected to the output of the power supply, and having at least two switching unit outputs for respective connection to one of the at least two process chambers;
   wherein the switching unit is configured to form from a direct current at the input an alternating current having a predetermined frequency of at least 40 KHz as an output signal and to selectively output the output signal as a pulse for a predetermined pulse duration to one of the switching unit outputs in response to a control signal from the control unit;
   wherein the control unit is configured to coordinate power requirements of the at least two process chambers and to drive the power supply and the switching unit such that at the respective switching unit outputs communicating with the process chambers, the power corresponding to the power requirements is provided as pulses over a period of time, wherein the pulses of the respective process chambers are temporally offset from each other such that the process chambers can be operated simultaneously; and
   wherein the control unit is configured to shift pulses or portions thereof in time with respect to the power requirements if the power requirements would lead to an overlapping of pulses at different outputs, wherein a respective time shift is selected such that the energy output at the respective outputs essentially corresponds to the power requirement over time.

2. The plasma generator according to claim 1, wherein the control unit has a number of controllers corresponding to the number of process units to be connected to the switching unit, each controller being configured to obtain process data on processes in a respective one of the process chambers, each controller being in connected to the power supply and/or the switch to drive the same in response to the received process data.

3. The plasma generator according to claim 1, further comprising at least one arc suppression unit configured to obtain and evaluate in real time current process data on processes in the at least two process chambers and current data of the power supply and/or the switch to detect an arc or an impending arc, wherein the arc suppression unit being in communication with the power supply and/or the switch to drive the same, if needed, in response to the detection of an arc or an impending arc, wherein the arc suppression unit may form part of the control unit.

4. The plasma generator according to claim 1, wherein the controllers and/or the at least one arc suppression unit are formed as separate software modules executable on a common processor or on separate processors of the plasma generator.

5. The plasma generator according to claim 1, wherein the switching unit has at least one third switching unit output configured for connection to at least one further process chamber or absorber, and wherein the switching unit is configured to, in response to an incoming control signal from the control unit, apply the output signal as a pulse selectively to a respective one of the switching unit outputs for a predetermined pulse duration.

6. The plasma generator according to claim 1, the control unit being configured to coordinate the sum of pulse duration and a corresponding pulse pause at the respective switching unit outputs such that the sum is equal in each case or that the sum at one of the switching unit outputs is a multiple of the sum at another switching unit output.

7. The plasma generator according claim 1, wherein the control unit is further configured to perform at least one of the following:
   split individual pulses into two separate pulses with respect to the power requirements and to shift them in time if the power requirements would result in overlapping of pulses at different outputs, wherein a respective splitting of the pulse and a respective time shift are selected such that the energy output at the respective outputs essentially corresponds to the power requirement over time;
   shift individual pulses in time with respect to the power requirements if the power requirements would lead to overlapping of pulses at different outputs, wherein a respective shift in time is selected such that the energy output at the respective outputs essentially corresponds to the power requirement over time; and
   vary at least one of the following parameters of a pulse: a position of a pulse in a pulse sequence, a division of a pulse into partial pulses, a pulse duration, and an amplitude of a pulse when actual power requirements would lead to overlapping of pulses at different outputs.

8. The plasma generator according to claim 1, wherein for the pulsed provision of electrical power at a frequency of at least 40 KHz to at least three process chambers, the plasma generator further comprises:
   a control unit configured to obtain and evaluate process data about processes in the at least three process chambers;
   an additional controllable power supply having an output, the controllable power supply being configured to output a direct current having a predetermined voltage and/or intensity at its output in response to a control signal from the control unit; and
   an additional switching unit having a power input connected to the output of the additional power supply and having at least three switching unit outputs for respective connection to one of the at least three process chambers;
   wherein the switching unit is configured to form from a direct current at the input an alternating current having a predetermined frequency of at least 40 KHz as an output signal and to selectively output the output signal as a pulse having a predetermined pulse duration to one of the switching unit outputs in response to a control signal from the control unit;
   wherein the control unit is configured to coordinate power requirements of the at least three process chambers and to drive the power supplies and the switching units such that at a respective one of the switching unit outputs, communicating with the process chambers, the respective power corresponding to the power requirements is in substance available as pulses over time, wherein the pulses provided by one switching unit for the process chambers are temporally offset from each other, while the pulses of the two switching units may overlap, wherein the power supplies may have different rated powers.

9. The plasma generator according to claim 1, wherein the power corresponding to the power requirements can have a deviation of +/−5% of the power requirements.

10. The plasma generator according to claim 1, wherein the power corresponding to the power requirements can have a deviation of +/−2% of the power requirements.

11. A plasma treatment apparatus comprising:
   at least two separate process chambers in each of which a plasma can be generated; and
   a plasma generator according to claim 1, wherein the process chambers are each connected to one of the switching unit outputs of the switching unit.

12. The plasma processing apparatus according to claim 11, wherein the at least two separate process chambers comprises at least three process chambers, wherein the switching unit of the plasma generator has at least three switching unit outputs, and the process chambers are each connected to one of the switching unit outputs.

13. A method for the pulsed provision of electrical power having a predetermined frequency of at least 40 KHz to at least two process chambers, the method comprising the steps of:
   providing a direct current having a predetermined voltage and/or intensity at an input of a switching unit in response to a control signal from a control unit; and
   forming, from the direct current, an alternating current output signal having a predetermined frequency of at least 40 KHz in the switching unit and, in response to a control signal from the control unit, selectively outputting the alternating current output signal as a pulse at one of at least two switching unit outputs of the switching unit, each of which is connected to one of the at least two process chambers;
   wherein the control unit generates control signals for providing the direct current and control signals for selectively outputting the alternating current output signal in response to power requirements of the at least two process chambers and in response to process data about processes in the at least two process chambers, wherein the control signals are coordinated such that at the respective switching unit outputs, which are connected to the process chambers, essentially the power corresponding to the power requirements is made available as pulses over time, and the pulses for the process chambers are temporally offset with respect to each other, while the process chambers operated simultaneously,
   wherein the control unit changes at least one of the following parameters of a pulse: a position of a pulse in a pulse sequence, a division of a pulse into partial pulses, a pulse duration and an amplitude of a pulse, if actual power requirements would lead to an overlapping of pulses at different outputs.

14. The method according to claim 13, wherein the control unit makes changes according to one of the following: predetermined fixed rules, rules adjustable by an operator, or by comparing the power output in pulses per process chamber over a period of time with the power requested over the period of time and automatically changing at least one parameter of a pulse on the basis of the comparison.

15. The method according to claim 13, wherein the electrical power is provided to at least three process chambers, wherein the switching unit has at least three switching unit outputs, each connected to one of the at least three process chambers; and
   wherein the control unit generates control signals for providing the direct current and control signals for selectively outputting the alternating current output signal in response to power requirements of the at least three process chambers and in response to process data about processes in the at least three process chambers, wherein the control signals are coordinated such that at the respective switching outputs, which are connected to the process chambers, the power corresponding to the power requirements is in substance made available as pulses over time, wherein the pulses for the process chambers are temporally offset from each other, while the process chambers are operated simultaneously.

16. The method according to claim 13, wherein the control unit coordinates the sum of pulse duration and a corresponding pulse pause at the respective switching unit outputs such that the sum is equal in each case or that the sum at one of the switching unit outputs is a multiple of the sum at another switching unit output.

17. The method according to claim 13 for the pulsed provision of electrical power having a predetermined frequency of at least 40 KHz to at least three process chambers, the method comprising the following further steps:
   providing a direct current having a predetermined voltage and/or intensity at an input of an additional switching unit in response to a control signal from the control unit;
   forming, from the direct current, an alternating current output signal having a predetermined frequency of at least 40 KHz in the additional switching unit and, in response to a control signal from the control unit, selectively outputting the alternating current output signal as a pulse having a predetermined pulse duration at one of at least three switching unit outputs of the additional switching unit, each of which is connected to one of the at least three process chambers;

wherein the control unit, in response to power requirements of the at least three process chambers and in response to process data about processes in the at least three process chambers, generates control signals for providing the direct current and control signals for selectively outputting the alternating current output signal, wherein the control signals are coordinated such that at the respective switching unit outputs, which are connected to the process chambers, the power corresponding to the power requirements is in substance made available as pulses over time, wherein the pulses which are output by one of the switching units are offset in time with respect to each other, while the pulses of the two switching units may overlap in time.

* * * * *